United States Patent
Shih et al.

(10) Patent No.: US 7,456,432 B2
(45) Date of Patent: Nov. 25, 2008

(54) SYSTEM HAVING ELECTROSTATIC DISCHARGE PROTECTION STRUCTURE AND METHOD FOR MANUFACTURING THE SAME

(75) Inventors: Yi-Fan Shih, Taipei (TW); Chun-Yen Liu, Hsinchu County (TW); Kuo-Bin Hsu, Changhua County (TW); Chang-Ho Tseng, Taoyuan County (TW); Shih-Chang Chang, Hsinchu County (TW)

(73) Assignee: TPO Displays Corp., Miao-Li County (TW)

( * ) Notice: Subject to any disclaimer, the term of this patent is extended or adjusted under 35 U.S.C. 154(b) by 0 days.

(21) Appl. No.: 11/561,593

(22) Filed: Nov. 20, 2006

(65) Prior Publication Data

US 2008/0117558 A1    May 22, 2008

(51) Int. Cl.
*H01L 27/12* (2006.01)

(52) U.S. Cl. .................................. 257/72; 257/E27.111

(58) Field of Classification Search .................... 257/49, 257/52, 57, 59, 66, 72, E27.111; 438/142, 438/149, 151; 349/19, 33, 40
See application file for complete search history.

(56) References Cited

U.S. PATENT DOCUMENTS

| 5,532,853 A | * | 7/1996 | Song et al. ................... 349/149 |
| 2003/0052616 A1 | * | 3/2003 | Antoniadis et al. ....... 315/169.3 |

* cited by examiner

*Primary Examiner*—Evan Pert
*Assistant Examiner*—Kevin Quinto
(74) *Attorney, Agent, or Firm*—Patterson, Thuente, Skaar & Christensen, P.A.

(57) ABSTRACT

A system having an electrostatic discharge protection structure and a method for manufacturing the structure are provided. The structure comprises a conducting layer, a material layer and a bridging layer wherein the conducting layer is divided into a first conducting portion and a second conducting portion to form a gap therebetween. The material layer is disposed onto the conducting layer, forming a first via hole to expose a part of the first conducting portion and a second via hole to expose a part of the second conducting portion. Finally, the bridging layer disposed onto the material layer electrically connects the first conducting portion to the second conducting portion within the first and second via holes, whereby the electrostatic produced during the manufacturing process would be prevented from damaging the driver circuits.

14 Claims, 7 Drawing Sheets

SYSTEM HAVING ELECTROSTATIC DISCHARGE PROTECTION STRUCTURE AND METHOD FOR MANUFACTURING THE SAME

CROSS-REFERENCES TO RELATED APPLICATIONS

Not applicable

BACKGROUND OF THE INVENTION

1. Field of the Invention

The present invention relates to a structure adapted for protecting the panel circuit against electrostatic discharges, more specifically, to a system having an electrostatic discharge protection structure adapted to electrically connect the driver circuit with the printed circuit of a display panel and a method for manufacturing the same.

2. Descriptions of the Related Art

Figure 1:
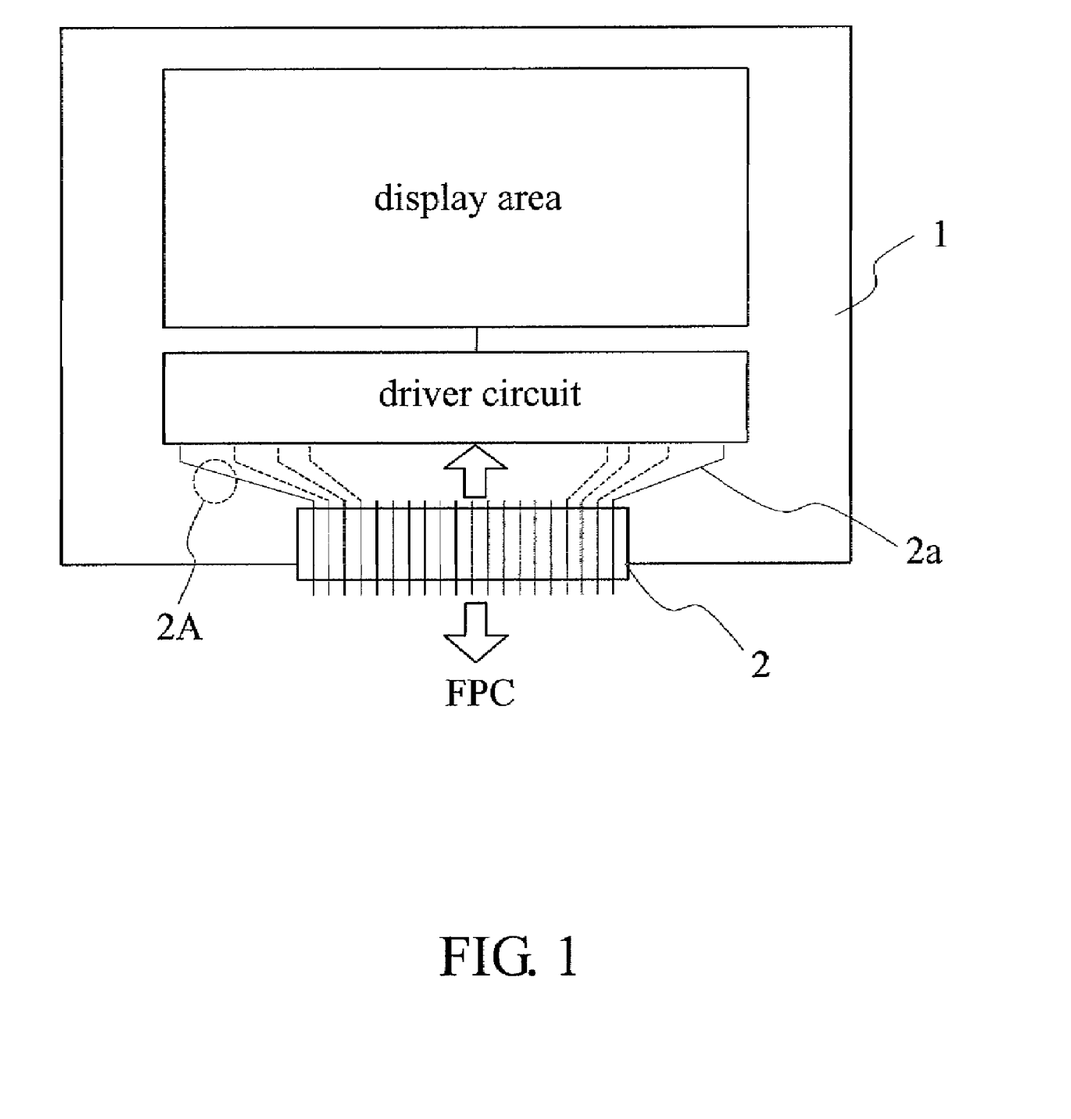
FIG. 1 is a schematic view illustrating a conceptual structure of an LCD or OLED panel.

The schematic view of a conventional panel structure of a TFT-LCD (thin-film-transistor liquid crystal display) or an OLED (organic light emitting diode or organic light emitting display) is shown in FIG. 1. Driver circuits, such as scan lines and data lines, are disposed onto a panel 1 and connected through a bonding pad 2 to flexible printed circuits (FPCs). In specific, the driver circuits electrically connect the bonding pad 2 to the FPCs by means of metal lines 2a. The so-called antenna effect usually occurs in the areas that the bonding pad 2 is located during the assembly process because electric charges tend to accumulate in those areas.

In the manufacturing process, especially during the planarization spin operation, coating on the array often gives rise to the antenna effect in the areas where the bonding pad 2 is located. The electrostatic discharge (ESD) may cause the driver circuit to fail when the ESD transfers through the metal lines 2a.

There has been recent interest in creating solutions to protect "whatever it is that is being protected" from ESDs. For example, current ESD protection procedures enlist the blocking of ESDs by disposing resistors or making short circuits. However, the conventional measures involved in "conducting these procedures (or processes)" consist of complicated circuit design and other unnecessary electrical elements.

Thus, an improved system having a structure for ESD protection that does not substantively introduce complicated layouts is required in the market to avoid failures of related components, such as driver circuits, during the manufacturing process.

SUMMARY OF THE INVENTION

The primary objective of this invention is to provide a system having an electrostatic discharge protection structure adapted for a TFT-LCD, by means of disposing an isolating conducting layer in the areas that the antenna effect typically occurs, and then bridging the isolating conducting layer afterward for electrical connection. The structure comprises a conducting layer, a material layer and a bridging layer. The conducting layer includes a first conducting portion and a second conducting portion disposed independently with the first conducting portion to form a gap therebetween. The material layer is disposed onto the conducting layer and includes a first material portion, a second material portion and an intermediate material portion disposed between the first and second material portions. The first material portion is disposed onto the first conducting portion and forms a first via hole with the intermediate material portion to expose a part of the first conducting portion, while the second material portion is disposed onto the second conducting portion and forms a second via hole with the intermediate portion to expose a part of the second conducting portion. In addition, a part of the intermediate material portion is located within the gap. The bridging layer is disposed onto the material layer with parts of the bridging layers located within the first and second via holes to electrically connect the first conducting portion to the second conducting portion.

Another objective of this invention is to provide a method for manufacturing an electrostatic discharge protection structure adapted for a TFT-LCD. A conducting layer is formed on a substrate comprising a first conducting portion, a second conducting portion to define a gap formed therebetween. A material layer is disposed on the conducting layer, wherein the material layer includes a first material portion, a second material portion and an intermediate material portion formed between the first and second material portions, whereby the first material portion is disposed on the first conducting portion and formed with a first via hole with the intermediate material portion to expose a part of the first conducting portion, the second material portion is disposed on the second conducting portion and formed with a second via hole with the intermediate material portion to expose a part of the second conducting portion, and at least a part of the intermediate material portion is located within the gap. A bridging layer is disposed on the material layer with parts of the bridging layer being located within the first and second via holes to electrically connect the first conducting portion to the second conducting portion.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 2A:
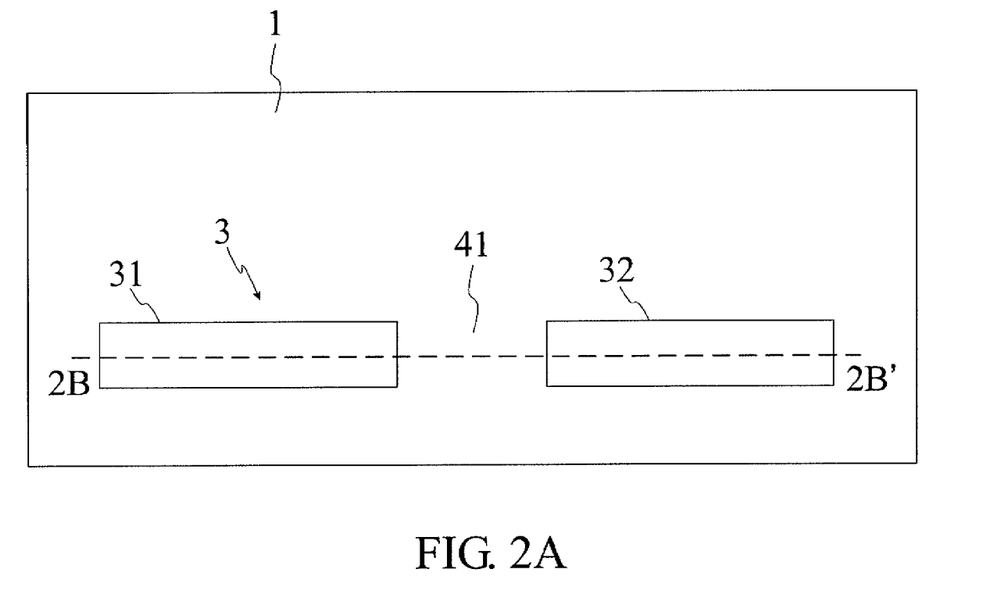
FIGS. 2A and 2B are schematic views illustrating the conducting layer of the present invention.
Figure 2B:
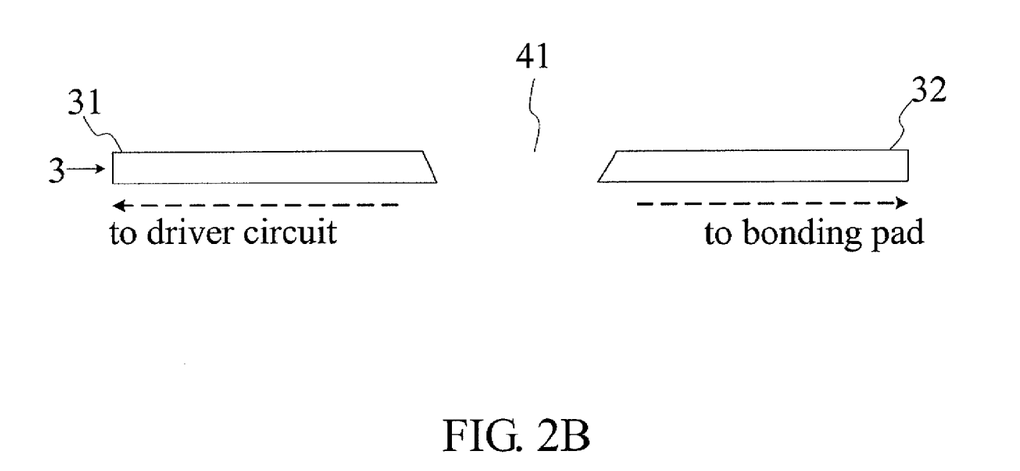

A system of the present invention, which has an electrostatic discharge (ESD) protection structure, is utilized to display images. The ESD protection structure adapted for a TFT-LCD is described as follows. According to an embodiment of the invention, the structure, which is disposed on the substrate for connecting the driver circuit and the FPC, is located on the area that indicated by the dash circle 2A in FIG. 1. The final structure is shown in FIG. 4B, which comprises a conducting layer 3, a material layer 5 and a bridging layer 7. FIG. 2A shows a top view illustrating the structure of the present invention and FIG. 2B shows a cross-sectional view along the dash line 2B-2B' of the structure. It is noted that the conducting layer 3 disposed on the panel 1 is illustrated in FIG. 2A with an enlarged view for describing with clarity. The conducting layer 3, as shown in FIGS. 2A and 2B, includes a first conducting portion 31 and a second conducting portion 32 disposed independently with the first conducting portion 31 to form a gap 41 therebetween. More specifically, the conducting layer 3 includes a plurality of metal lines in which the first conducting portion 31 connects with driver circuits and the second conducting portion 32 connects with the bonding pad 2. The first conducting portion 31 and the second conducting portion 32 are formed preferably by division, either by etching or photoresisting the conducting layer 3 into two components. Thus, the conducting layer 3 is non-conductive, leaving the bonding pad 2 isolated from the driver circuits.

Figure 3A:
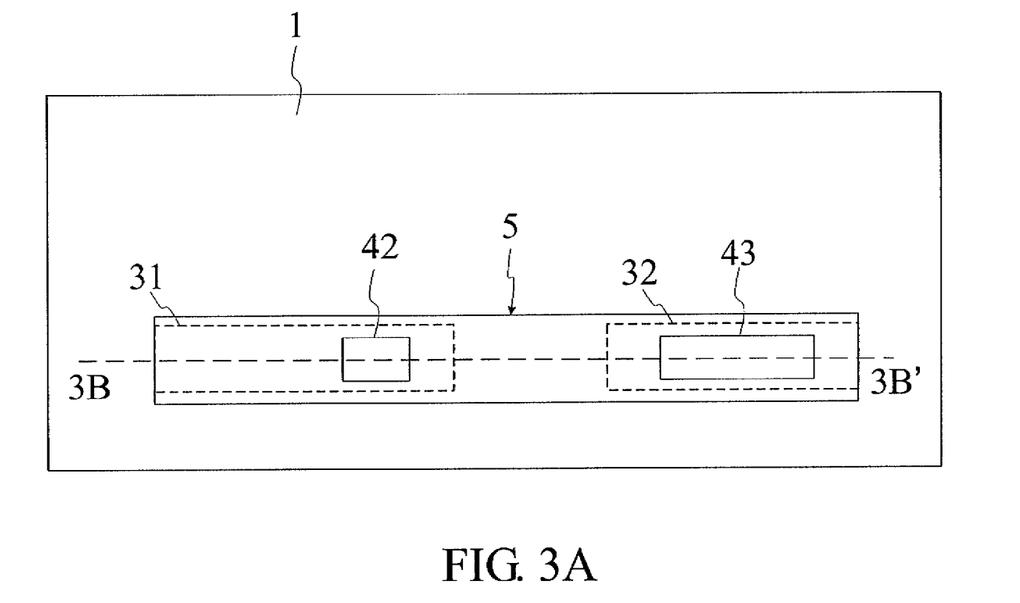
FIGS. 3A and 3B are schematic views illustrating the conducting layer associated with the material layer of the present invention.
Figure 3B:
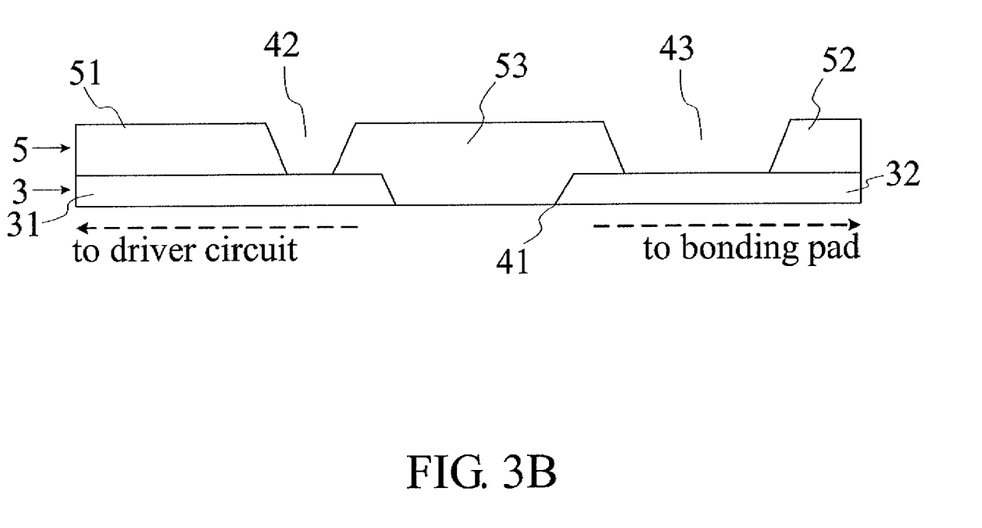

FIG. 3A illustrates a top view of the present invention with the material layer 5 and FIG. 3B illustrates a cross-sectional view along the dash line 3B-3B'. The material layer 5 can be a planarization layer, which is disposed onto the conducting layer 3. The material layer 5 includes a first material portion 51, a second material portion 52 and an intermediate material portion 53 which is disposed between the first material portion 51 and the second material portion 52. The first material portion 51 is disposed onto the first conducting portion 31, forming a first via hole 42 with the intermediate material portion 53 to expose a part of the first conducting portion 31. Similarly, the second material portion 52 is disposed onto the second conducting portion 32, forming a second via hole 43 with the intermediate material portion 53 to expose a part of the second conducting portion 32. Furthermore, a part of the intermediate material portion 53 is located within the gap 41. Thus, the exposed areas of the first conducting portion 31 and the second conducting portion 32 are reserved for electrical connection by other components disposed thereon. According to various embodiments, the second via hole 43 can be larger than the first via hole 42, thus conductive resistance can be reduced.

Figure 4A:
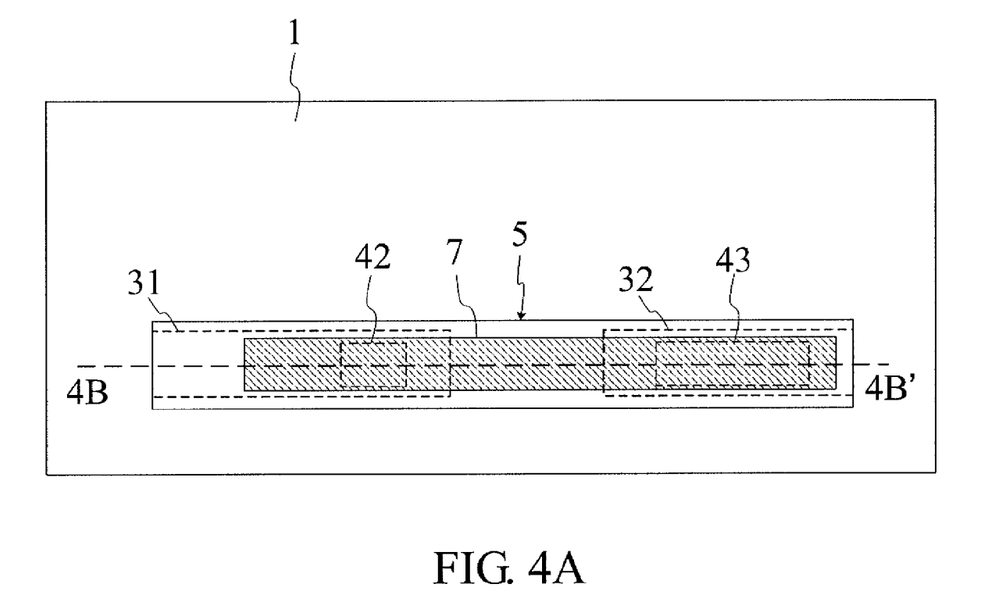
FIGS. 4A and 4B are schematic views illustrating the conducting layer and the material layer associated with the bridging layer of the present invention.
Figure 4B:
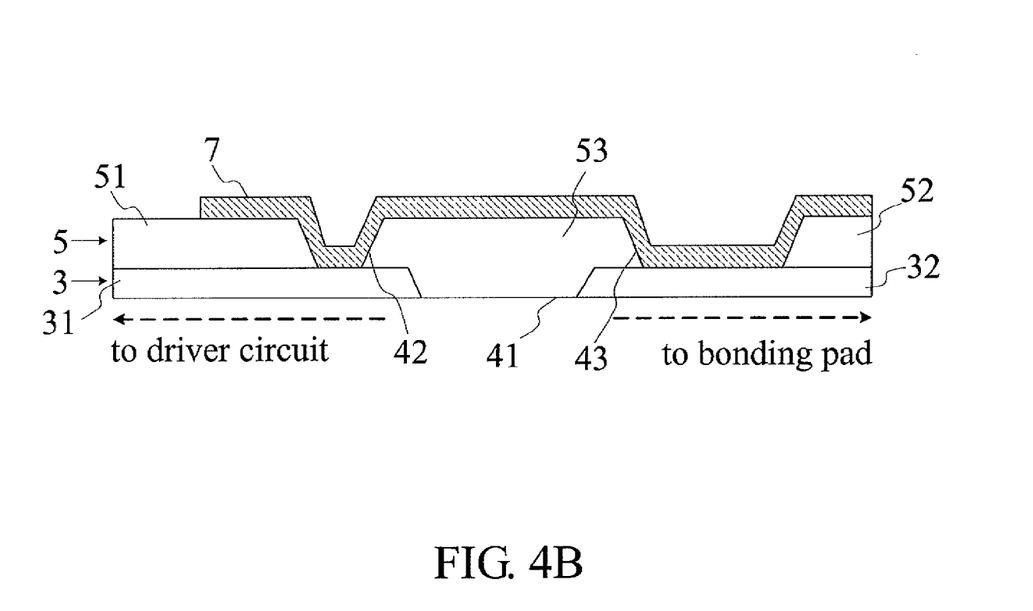

The bridging layer 7, as shown in FIGS. 4A and 4B, is disposed onto the material layer 5 with parts of the bridging layer 7 located between the first via hole 42 and the second via hole 43 to electrically connect the first conducting portion 31 to the second conducting portion 32. Thus, the electrostatic discharge generated on the bonding pad 2 would not affect the driver circuits via the metal lines because the bonding pad 2 is isolated from the driver circuits during the manufacturing process.

Figure 5A:
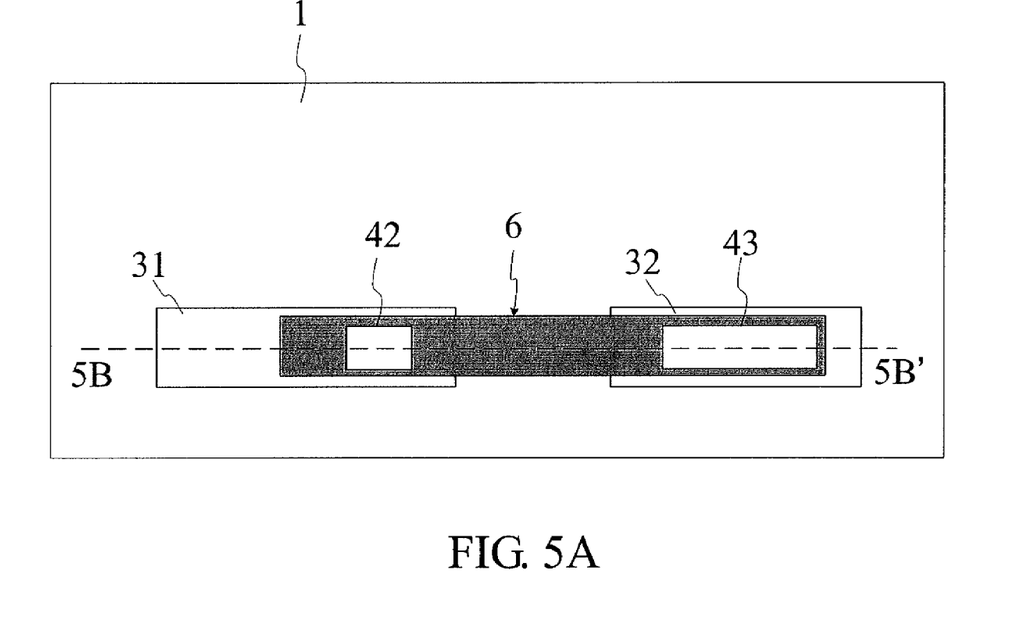
FIGS. 5A and 5B are schematic views illustrating the conducting layer associated with the protection layer of the present invention.
Figure 5B:
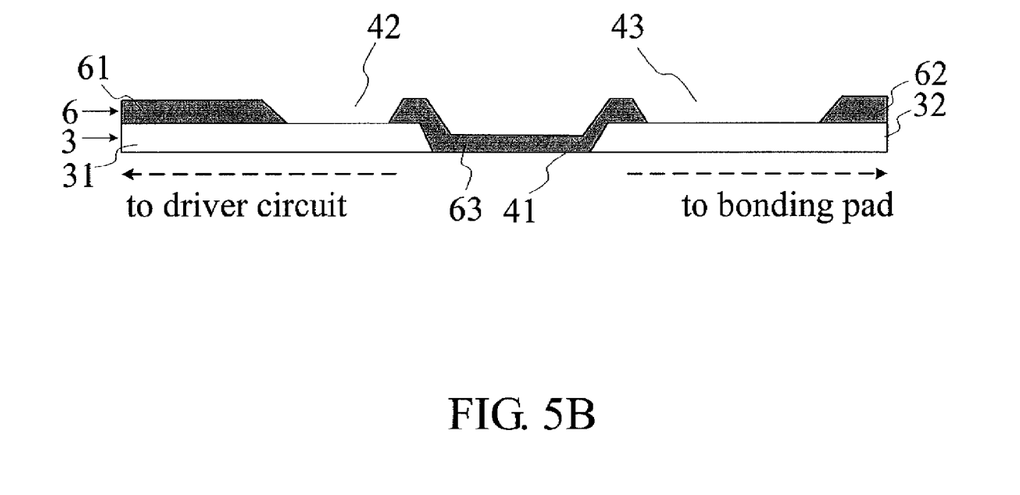
Figure 6:
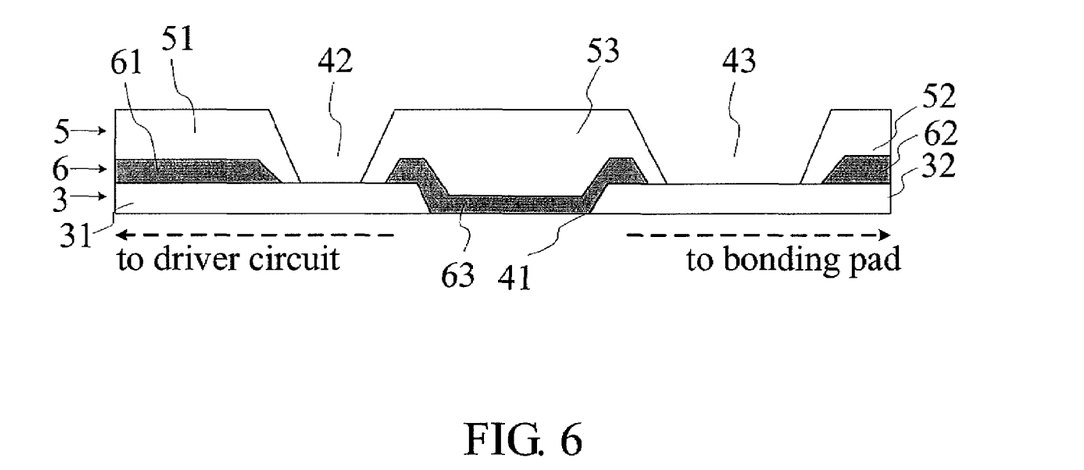
FIG. 6 is a schematic cross-sectional view illustrating the conducting layer and the protection layer associated with the material layer of the present invention.
Figure 7:
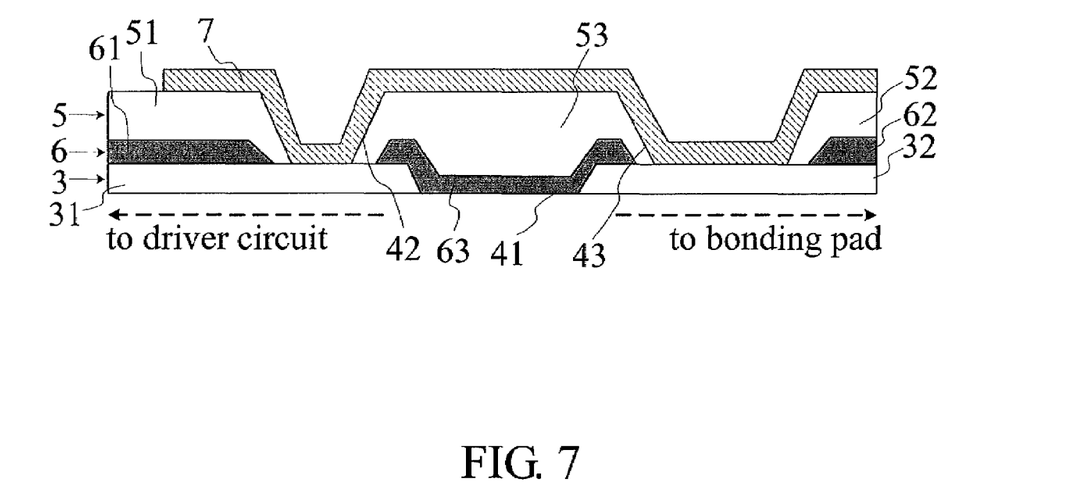
FIG. 7 is a schematic cross-sectional view illustrating the conducting layer, the protection layer and the material layer associated with the bridging layer of the present invention.

The above-mentioned structure is provided, preferably, for use in a TFT-LCD. When the electrostatic discharge protection structure is used for an OLED (e.g. an active matrix organic light emitting diode or display, AMOLED), the material layer 5 of the above structure further comprises a protection layer 6 disposed under the material layer 5 to avoid gas and moisture that come from the material layer 5. As shown in FIGS. 5A and 5B, after the conducting layer 3 forms into the first conducting portion 31 and the second conducting portion 32 to define the gap 41 therebetween, the protection layer 6 is disposed thereon. The protection layer 6 includes a first protection portion 61, a second protection portion 62 and an intermediate protection portion 63, which is disposed between the first protection portion 61 and the second protection portion 62. The first protection portion 61 is disposed onto the first conducting portion 31, forming a first via hole 42 with the intermediate protection portion 63 to expose a part of the first conducting portion 31, and the second protection portion 62 is disposed onto the second conducting portion 32, forming a second via hole 43 with the intermediate protection portion 63 to expose a part of the second conducting portion 32. Furthermore, a part of the intermediate protection portion 63 is located within the gap 41. As shown in FIG. 6 and FIG. 7, the material layer 5 and the bridging layer 7 are disposed in the previously mentioned manner to electrically connect the first conducting portion 31 to the second conducting portion 32, especially since portions of the bridging layer 7 fall within the first and second via holes 42, 43.

The bridging layer 7 can be made of transparent, translucent, opaque materials, or reflective alloy in response to various needs. For example, a bridging layer 7 that is made of transparent material for use in a transmission LCD or a bottom emission type OLED, can be a metallic oxide, which is selected from the group consisting of ITO (indium tin oxide), IZO (indium zinc oxide) and etc., that facilitates lights penetrating. The bridging layer 7 that is being used in a reflective or transreflective LCD or a top emission type OLED should be made of translucent, opaque, or reflective alloy, such as Al/Nd (aluminum/neodymium). The dual/multiple metal layer can serve as the bridging layer 7 in the application of the reflective or transreflective LCD.

Figure 8:
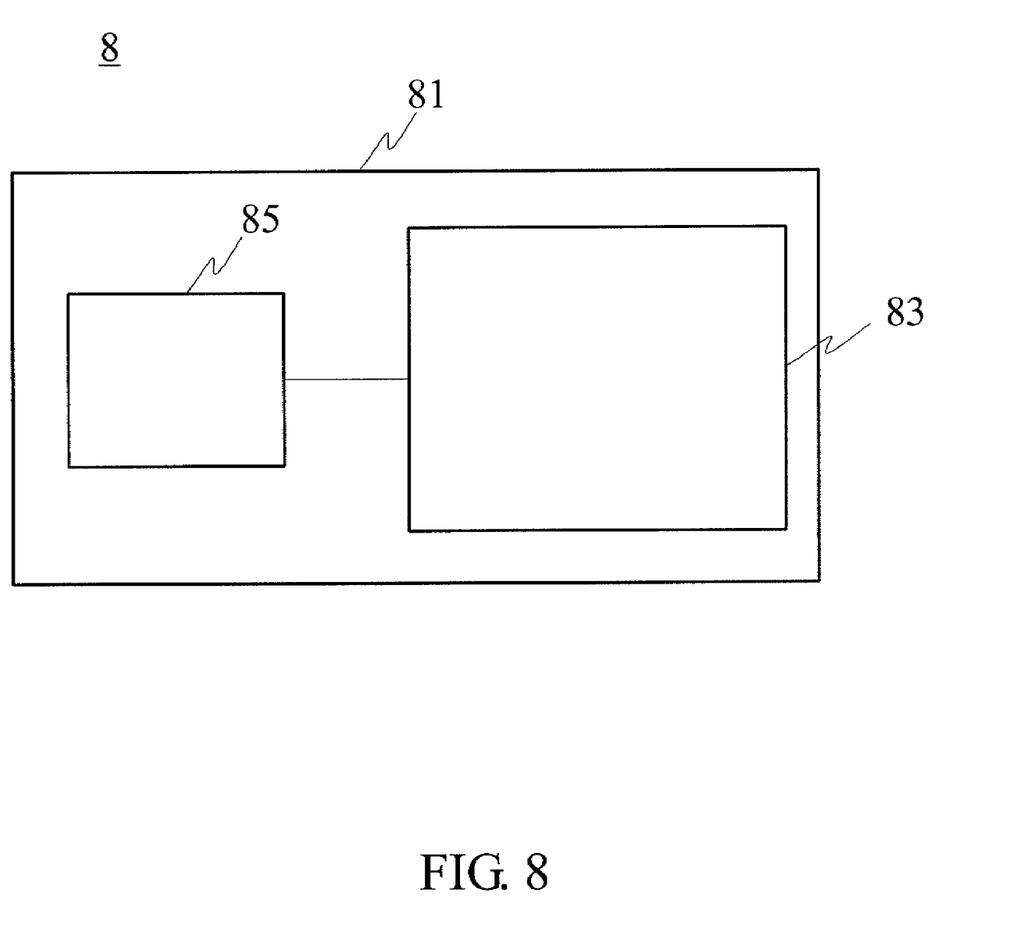
FIG. 8 is a schematic view illustrating the system of the present invention.

The aforesaid structure can be integrated into the system 8 of the present invention as shown in FIG. 8. The system 8 for displaying images further comprises an electronic device 81 which includes a display panel 83 and an input device 85. The display panel 83 comprises an ESD protection structure, such as the ESD protection structure shown in FIG. 4B and FIG. 7. The input device 85 is coupled to the display panel 83 and operative to provide input to the display panel 83 for displaying images. More specifically, the electronic device 81 is, but is not limited to be, selected from the group of a PDA, a display monitor, a notebook computer, a tablet computer, a digital camera, a television, a car display, a portable DVD player, a cellular phone, and the combination thereof.

According to the above structure, the present invention is to further disclose a method for manufacturing the electrostatic discharge protection structure. The method comprises the steps as disclosed below. Please refer to FIGS. 2A~4B first, the conducting layer 3 is formed into the first conducting portion 31 and the second conducting portion 32 to define the gap 41 therebetween. Then, the material layer 5 is disposed onto the conducting layer 3, wherein the material layer 5 includes the first material portion 51, the second material portion 52 and the intermediate material portion 53 which is formed between the first material portion 51 and the second material portion 52. The first material portion 51 is disposed onto the first conducting portion 31 and forming the first via hole 42 with the intermediate material portion 53 to expose a part of the first conducting portion 31. The second material portion 52 is disposed onto the second conducting portion 32 and forming the second via hole 43 with the intermediate material portion 53 to expose a part of the second conducting portion 32. Furthermore, a part of the intermediate material portion 53 is located in the gap 41. In addition, the bridging layer 7 is disposed onto the material layer 5 with parts of the bridging layer 7 located in the first via hole 42 and the second via hole 43 to electrically connect the first conducting portion 31 to the second conducting portion 32.

According to another embodiment, please refer to FIGS. 5A~7, the method for manufacturing the electrostatic discharge protection structure further comprises disposing a protection layer 6 onto the conducting layer 3 and the gap 41 before disposing the material layer 5, and partially exposing a portion of the first conducting portion 31 and the second conducting portion 32.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A system having an electrostatic discharge protection structure which is adapted to electrically connect a driver circuit with a bonding pad of a display panel, the structure comprising:

a conducting layer including a first conducting portion and a second conducting portion disposed independently with the first conducting portion to form a gap therebetween wherein the first conducting portion connects to the driver circuit and the second conducting portion connects to the bonding pad;

a material layer disposed on the conducting layer, the material layer including a first material portion, a second material portion and an intermediate material portion disposed between the first and second material portions, wherein the first material portion is disposed on the first conducting portion and forms a first via hole with the intermediate material portion to expose a part of the first conducting portion, the second material portion is disposed on the second conducting portion and forms a second via hole with the intermediate material portion to expose a part of the second conducting portion, and at least a part of the intermediate material portion is located within the gap; and a bridging layer disposed on the material layer with parts of the bridging layers being located within the first and second via holes to electrically connect the first conducting portion to the second conducting portion.

2. The system as claimed in claim 1, wherein the conducting layer includes a plurality of metal lines.

3. The system as claimed in claim 1, wherein the first conducting portion connects with driver circuits.

4. The system as claimed in claim 1, wherein the second conducting portion connects with bonding pads.

5. The system as claimed in claim 1, wherein the material layer is a planarization layer.

6. The system as claimed in claim 5, wherein the material layer further comprises a protection layer disposed under the planarization layer.

7. The system as claimed in claim 1, wherein the bridging layer is made of transparent material which is a metallic oxide.

8. The system as claimed in claim 7, wherein the metal oxide is selected from the group consisting of ITO and IZO.

9. The system as claimed in claim 1, wherein the bridging layer is made of translucent, opaque, or reflective alloy.

10. The system as claimed in claim 1, wherein the bridging layer is translucent, opaque, or reflective dual/multiple metal layer.

11. The system as claimed in claim 1, further comprising an electronic device which includes:

the display panel; and an input device coupled to the display panel and operative to provide input to the display panel for displaying images.

12. The system as claimed in claim 11, wherein the electronic device is selected from the group of a PDA, a display monitor, a notebook computer, a tablet computer, a digital camera, a television, a car display, a portable DVD player, a cellular phone, and the combination thereof.

13. A method for manufacturing an electrostatic discharge protection structure being adapted to electrically connect a driver circuit with a bonding pad, the method comprising the steps of:

(a) forming a conducting layer into a first conducting portion, a second conducting portion to define a gap formed therebetween, wherein the first conducting portion connects to the driver circuit and the second conducting portion connects to the bonding pad;

(b) disposing a material layer on the conducting layer, wherein the material layer includes a first material portion, a second material portion and an intermediate material portion formed between the first and second material portions, whereby the first material portion is disposed on the first conducting portion and formed with a first via hole with the intermediate material portion to expose a part of the first conducting portion, the second material portion is disposed on the second conducting portion and formed with a second via hole with the intermediate material portion to expose a part of the second conducting portion, and at least a part of the intermediate material portion is located within the gap; and (c) disposing a bridging layer on the material layer with parts of the bridging layer being located within the first and second via holes to electrically connect the first conducting portion to the second conducting portion.

14. The method as claimed in claim 13, further comprising a step (d) performed after step (a), in which step (d) is:

(d) disposing a protection layer on the conducting layer and the gap, wherein each of the first and second conducting portions being partially exposed.

* * * * *